US012575392B2

(12) United States Patent
Qu et al.

(10) Patent No.: US 12,575,392 B2
(45) Date of Patent: Mar. 10, 2026

(54) METHOD TO DEPOSIT METAL CAP FOR INTERCONNECT

(71) Applicant: Applied Materials, Inc., Santa Clara, CA (US)

(72) Inventors: Ge Qu, Sunnyvale, CA (US); Qihao Zhu, Sunnyvale, CA (US); Zheng Ju, Sunnyvale, CA (US); Yang Zhou, Milpitas, CA (US); Jiajie Cen, San Jose, CA (US); Feng Q. Liu, San Jose, CA (US); Zhiyuan Wu, San Jose, CA (US); Feng Chen, San Jose, CA (US); Kevin Kashefi, San Ramon, CA (US); Xianmin Tang, San Jose, CA (US); Jeffrey W. Anthis, Santa Clara, CA (US); Mark Joseph Saly, Milpitas, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 655 days.

(21) Appl. No.: 18/074,335

(22) Filed: Dec. 2, 2022

(65) Prior Publication Data

US 2024/0186181 A1 Jun. 6, 2024

(51) Int. Cl.
*H01L 21/3205* (2006.01)
*H01L 21/768* (2006.01)

(52) U.S. Cl.
CPC .. *H01L 21/76849* (2013.01); *H01L 21/32051* (2013.01); *H01L 21/76877* (2013.01)

(58) Field of Classification Search
CPC ......... H01L 27/76849; H01L 21/32051; H01L 21/76877
See application file for complete search history.

(56) References Cited

U.S. PATENT DOCUMENTS

| | | | |
|---|---|---|---|
| 2009/0209101 A1* | 8/2009 | Shinriki | H01L 21/76843 257/E21.17 |
| 2018/0204759 A1* | 7/2018 | Bruce | H01L 21/7682 |
| 2019/0112460 A1* | 4/2019 | Abubakar | C08L 23/12 |
| 2019/0185993 A1* | 6/2019 | Chen | C23C 16/04 |
| 2020/0343136 A1* | 10/2020 | Yu | H01L 21/67184 |
| 2022/0028795 A1* | 1/2022 | Xu | H01L 21/76849 |
| 2022/0064784 A1* | 3/2022 | Xu | H01L 21/02068 |

FOREIGN PATENT DOCUMENTS

| | | | | |
|---|---|---|---|---|
| CN | 101395297 B | * | 3/2012 | C23C 16/18 |
| KR | 10-2019-0049587 | * | 5/2019 | H01L 21/02 |
| WO | WO 2017/104619 A1 | * | 6/2017 | C07F 19/00 |

OTHER PUBLICATIONS

Brooks, Samantha, et al., "Calculations on the Ruthenium-Catalyzed Diene and Dienyne Ring-Closing Metathesis Reactions in the Synthesis of Taxol Derivatives". The Journal of Organic Chemistry, 2021 ,86, 13056-13070.*

(Continued)

*Primary Examiner* — Bret P Chen
(74) *Attorney, Agent, or Firm* — Moser Taboada

(57) ABSTRACT

Methods to deposit a metal cap for an interconnect are disclosed. In embodiments, a method comprises contacting the substrate with an alkyl halide and a ruthenium metal precursor to form a metal cap for an interconnect.

20 Claims, 5 Drawing Sheets

(56) References Cited

OTHER PUBLICATIONS

Fu, Gregory C., et al., "Catalytic Ring-Closing Metathesis of Functionalized Dienes by a Ruthenium Carbene Complex". Journal of American Chemical Society, 1993, 115, 9856-9857.*

Geary, Laina M., et al., "Successive C—C Coupling of Dienes to Vicinally Dioxygenated Hydrocarbons: Ruthenium Catalyzed [4+2] Cycloaddition across the Diol, Hydroxycarbonyl, or Dione Oxidation Levels". Journal of the American Chemical Society, 2013, 135, 3796-3799.*

Bender, Matthias, et al., "Ruthenium-catalyzed insertion of adjacent diol carbon atoms into C—C bonds: Entry to type II polyketides". Science, 357, 779-781 (2017), pp. 1-3.*

Kim, Hye-Mi, et al., "Area-Selective Atomic Layer Deposition of Ruthenium Using a Novel Ru Precursor and H2O as a Reactant". Chemistry of Materials, 2021, 33, 4353-4361.*

* cited by examiner

METHOD TO DEPOSIT METAL CAP FOR INTERCONNECT

FIELD

Embodiments of the disclosure generally relate to methods for forming interconnects in electronic devices. In particular, embodiments of disclosure relate to methods and electronic devices using a highly selected ruthenium precursor for capping.

BACKGROUND

Interconnects are typically located within vias and trenches disposed into a substrate. These vias and trenches are lined with various metals, filled with copper or other metallic conductor, and a cap is disposed thereover to encapsulate the metallic conductor. Cobalt (Co) liners and Co caps have been used to provide improved Cu reflow and gapfill and help to prevent early Cu electromigration failure caused by the tendency of Cu to migrate in the surrounding substrate, which is mitigated by a barrier layer.

The Inventors have observed that as interconnects and other features of the substrate are reduced, Co liners and caps have become problematic due at least in part to poor reflow characteristics at spacings of less than about 20 nm. The Inventors have introduced Ru liners which have been observed to provide improved introduced with better Cu reflow properties as interconnect scales down. However, the Inventors have observed that Ru only liners result in early EM failure, which is thought to be the result of Co cap diffusion into the Ru liner sidewall, resulting in a weak cap interface. The Inventors have provided a new capping material suitable for use in liner scale down for future technology nodes.

SUMMARY

In an embodiment, a method of selectively depositing a ruthenium metal cap layer atop an upper metal surface of an interconnect of a substrate comprises contacting the substrate with an alkyl halide having a general formula (I):

$$R—X_a; \tag{I}$$

wherein R is an alkyl moiety having from 1 to 6 carbon atoms and each X is, independently, Br or I; and a is 1 or 2; and contacting the substrate with a ruthenium metal precursor having a general formula (II):

$$R^1—Ru—R^2; \tag{II}$$

wherein $R^1$ comprises a substituted aromatic ring; and $R^2$ is a diene comprising at least 4 carbon atoms.

In an embodiment, a method of selectively depositing a ruthenium metal cap layer atop an upper metal surface of an interconnect of a substrate comprises performing a plurality of deposition cycles within a deposition chamber, each deposition cycle comprising: a) contacting the substrate with an alkyl halide having a general formula (I):

$$R-Xa; \tag{I}$$

wherein R is an alkyl moiety having from 1 to 6 carbon atoms; each X is, independently, Br or I; and a is 1 or 2; b) purging the deposition chamber; c) contacting the substrate with a ruthenium metal precursor having a general formula (II):

$$R^1—Ru—R^2; \tag{II}$$

wherein $R^1$ comprises a substituted aromatic ring and $R^2$ is a diene comprising at least 4 carbon atoms; and d) purging the deposition chamber.

Other and further embodiments of the present disclosure are described below.

BRIEF DESCRIPTION OF THE DRAWINGS

Embodiments of the present disclosure, briefly summarized above and discussed in greater detail below, can be understood by reference to the illustrative embodiments of the disclosure depicted in the appended drawings. However, the appended drawings illustrate typical embodiments of the disclosure and are therefore not to be considered limiting of scope, for the disclosure may admit to other equally effective embodiments.

Figure 1:
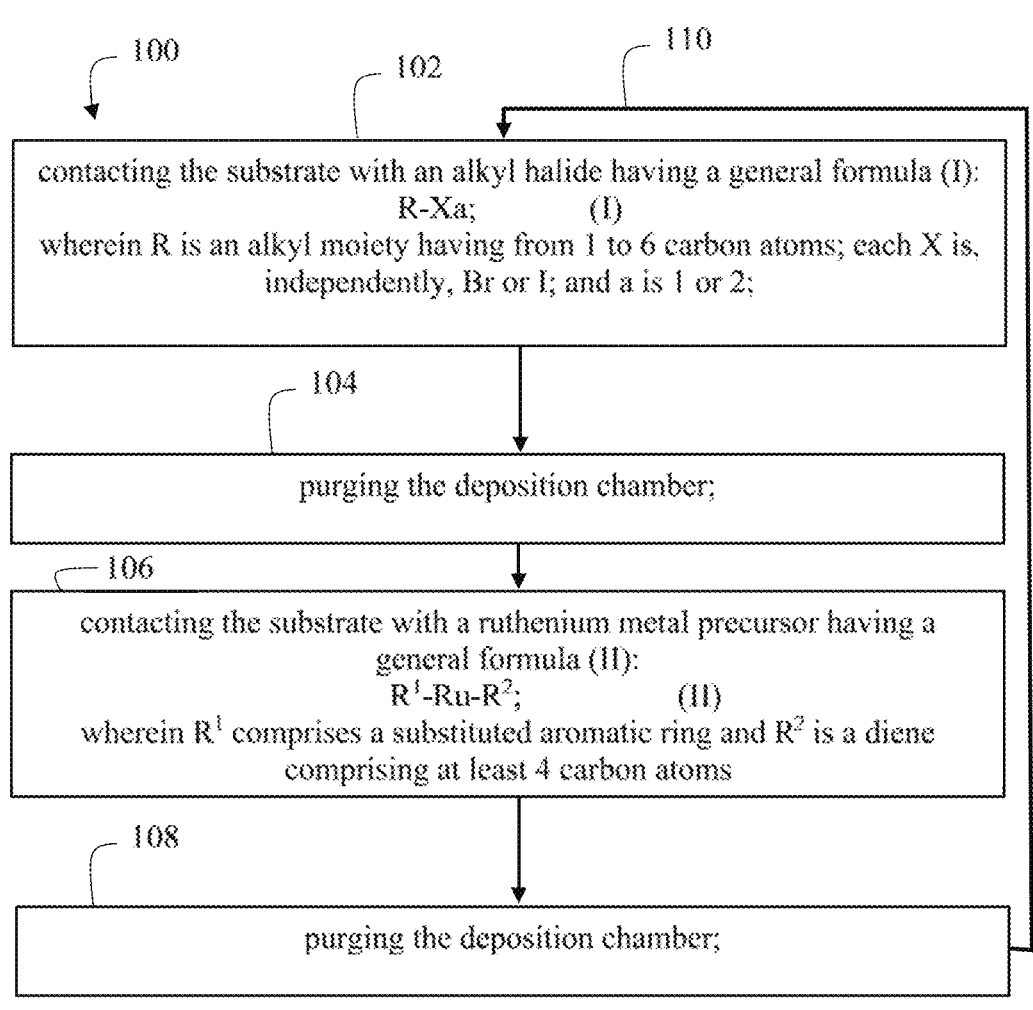
FIG. 1 depicts a flow chart of a method for selectively depositing a ruthenium metal cap layer atop an upper metal surface of an interconnect of a substrate in accordance with some embodiments of the present disclosure.

To facilitate understanding, identical reference numerals have been used, where possible, to designate identical elements that are common to the figures. The figures are not drawn to scale and may be simplified for clarity. Elements and features of one embodiment may be beneficially incorporated in other embodiments without further recitation.

DETAILED DESCRIPTION

For purposes of the present disclosure and the claims hereto, the numbering scheme for the Periodic Table Groups is according to the new notation of the IUPAC Periodic Table of Elements.

In the structures depicted herein, a solid line indicates a bond.

The terms "alkyl" e.g. "alkyl radical", "alkyl group", and the like, are used interchangeably herein unless otherwise specified. As used herein, an alkyl radical is defined to be a moiety comprising carbon and hydrogen, and may further comprise one or more elements selected from Groups 14 through 17 of the Periodic Table of Elements, having an index of hydrogen deficiency IHD, also referred to as the degree of saturation, of zero (0) when determined according to the formula:

$$IHD=((2n+2)–X)/2$$

wherein n is the number of carbon atoms and X is the sum of hydrogen and halogen atoms.

For purposes herein, unless otherwise indicated, an alkyl group may comprise a linear or branched monovalent radical comprising from 1 to 20 carbon atoms. Alkyl groups may be further substituted with halogens, i.e., F, Cl, Br, I, or a combination thereof.

For purposes herein, a diene refers to an unsaturated linear, branched, or cyclic hydrocarbon or halocarbon comprising two carbon-carbon double bonds. Unless otherwise indicated, the dienes may be cumulated (e.g., allenes) in which the double bonds are adjacent to one-another, conjugated wherein the double bonds are separated by one single carbon-carbon bond, or isolated, wherein the double bonds are separated by more than one $sp^3$ carbon atom.

In embodiments, an alicycle moiety refers to a monovalent radical comprising one or more rings which may be either saturated or unsaturated, but which is not an aromatic ring system. Unless otherwise indicated, alicyclic moieties may have one or more aliphatic side chains attached to the ring.

In embodiments, a method of selectively depositing a ruthenium metal cap layer atop an upper metal surface of an interconnect of a substrate comprises contacting the substrate with an alkyl halide having a general formula (I):

$$R—X_a; \tag{I}$$

wherein R is an alkyl moiety having from 1 to 6 carbon atoms and each X is, independently, Br or I; and a is 1 or 2; and contacting the substrate with a ruthenium metal precursor having a general formula (II):

$$R^1—Ru—R^2; \tag{II}$$

wherein $R^1$ comprises a substituted aromatic ring; and $R^2$ is a diene comprising at least 4 carbon atoms.

In embodiments, the substrate is contacted with the alkyl halide at a temperature of less than or equal to about 300° C. for less than or equal to about 10 seconds. In embodiments, the substrate is contacted with the ruthenium precursor at a temperature of less than or equal to about 300° C. for less than or equal to about 10 seconds.

In embodiments, $R^1$ comprises a $C_1$-$C_6$ alkyl or dialkyl substituted benzene ring. In embodiments, $R^2$ comprises a 1,3 diene comprising from 4 to 6 carbon atoms. In another embodiment, $R^2$ comprises a 1,4 diene comprising from 5 to 6 carbon atoms. In still another embodiment, $R^2$ comprises an alicyclic diene. In embodiments, $R^2$ comprises a dialkyl substituted diene comprising 6 or more carbon atoms.

In an embodiment, $R^2$ comprises an isoprene moiety. In an embodiment, $R^2$ is 2,3-dimethyl-1,3-butadiene.

In embodiments, the alkyl halide comprises methyl iodide, diiodomethane, methylbromide, dibromomethane, bromoiodomethane, or a combination thereof. In an embodiment, the alkyl halide consists essentially of diiodomethane.

In embodiments, a method of selectively depositing a ruthenium metal cap layer atop an upper metal surface of an interconnect of a substrate comprises performing a plurality of deposition cycles within a deposition chamber, each deposition cycle comprising: a) contacting the substrate with an alkyl halide having a general formula (I):

$$R—X_a; \tag{I}$$

wherein R is an alkyl moiety having from 1 to 6 carbon atoms; each X is, independently, Br or I; and a is 1 or 2; b) purging the deposition chamber; c) contacting the substrate with a ruthenium metal precursor having a general formula (II):

$$R^1—Ru—R^2; \tag{II}$$

wherein $R^1$ comprises a substituted aromatic ring and $R^2$ is a diene comprising at least 4 carbon atoms; and d) purging the deposition chamber.

In an embodiment, the ruthenium metal cap layer is deposited at a rate of greater than or equal to about 0.2 Å/cycle. In an embodiment, the ruthenium metal cap layer has a carbon content less than or equal to about 2% carbon on an atomic basis. In embodiments, the ruthenium metal cap layer has a purity of greater than or equal to about 97 wt % ruthenium metal.

In embodiments, the deposition cycle does not include formation or utilization of a plasma.

In an embodiment, a substrate comprises a metal capped interconnect comprising a ruthenium liner and a ruthenium metal cap layer encapsulating a copper metal fill material, wherein a width of the interconnect is less than or equal to about 20 nm. In some of such embodiments, the ruthenium metal cap layer has a thickness of less than or equal to about 2 nm.

FIG. 1 depicts a flow chart of a method 100 for depositing a ruthenium metal cap layer atop an upper metal surface of an interconnect of a substrate in accordance with some embodiments of the present disclosure. The method 100 comprises performing a plurality of deposition cycles (arrow 110), within a deposition chamber, each deposition cycle comprises: (process sequence 102) contacting the substrate with an alkyl halide having a general formula (I):

$$R—X_a; \tag{I}$$

wherein R is an alkyl moiety having from 1 to 6 carbon atoms; each X is, independently, Br or I; and a is 1 or 2; (process sequence 104) purging the deposition chamber; (process sequence 106) contacting the substrate with a ruthenium metal precursor having a general formula (II):

$$R^1—Ru—R^2; \tag{II}$$

wherein $R^1$ comprises a substituted aromatic ring and $R^2$ is a diene comprising at least 4 carbon atoms; and (process sequence 108) purging the deposition chamber.

The method 100 is further described below with respect to an interconnect structure, as depicted in FIGS. 2A-2D and FIG. 3. The method 100 may be performed in any suitable process chambers configured for atomic layer deposition (ALD). Exemplary processing systems that may be used to perform the inventive methods disclosed herein may include, but are not limited to, any of the line of processing systems, and the process chambers commercially available from Applied Materials, Inc., of Santa Clara, CA. Other process chambers, including ones available from other manufacturers, may also be suitably used in connection with the teachings provided herein.

Figure 2A:
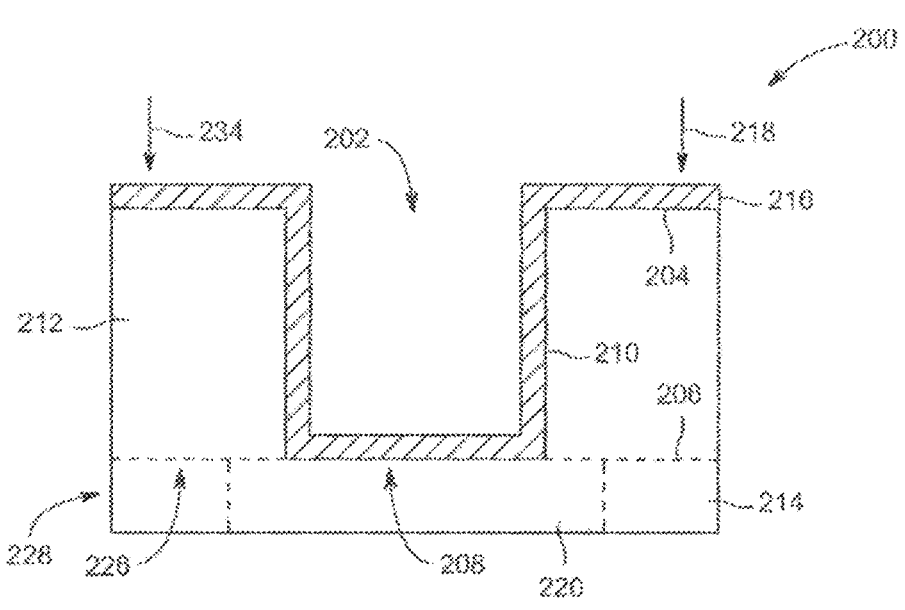
FIGS. 2A-2D depict side cross-sectional views of an interconnect structure formed in accordance with some embodiments of the present disclosure.
Figure 2B:
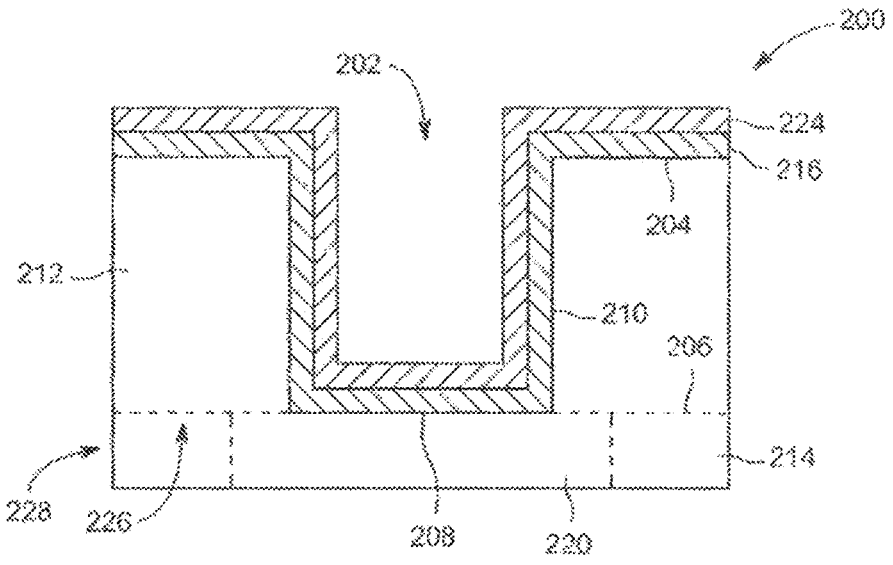

FIG. 2A depicts a substrate 200 having an opening 202 formed in a first surface 204 of the substrate 200 and extending into the substrate 200 towards an opposing second surface 206 of the substrate 200. The substrate 200 may be any suitable substrate having an opening 202 formed in the substrate. For example, the substrate 200 may comprise one or more of a dielectric material, silicon (Si), metals, or the like. In addition, the substrate 200 may include additional layers of materials or may have one or more completed or partially completed structures formed in, or on, the substrate 200. For example, the substrate 200 may include a first dielectric layer 212, such as silicon oxide, a low-k material (e.g., a material having a dielectric constant less than silicon oxide, or less than about 3.9), or the like. The opening 202 may be formed in the first dielectric layer 212. In some embodiments, the first dielectric layer 212 may be disposed atop a second dielectric layer 214, such as silicon oxide, silicon nitride, silicon carbide, or the like. A first conductive material (e.g., conductive material 220) may be disposed in the second dielectric layer 214 and may be aligned with the opening 202 such that the opening, when filled with a second conductive material, provides an electrical path to and from the first conductive material.

The opening 202 may be any opening, such as a via, trench, dual damascene structure, or the like. In some embodiments, the opening 202 may have a height to width aspect ratio of about 4:1 or more (e.g., a high aspect ratio). The opening 202 may be formed by etching the substrate 200 using any suitable etch process. The opening 202 includes a bottom surface 208 and sidewalls 210.

In some embodiments, the substrate 200 may be covered with one or more layers prior to depositing the ruthenium capping layer as described below. For example, the side-walls 210 of the opening 202, the bottom surface 208 of the opening, and the first surface 204 of the substrate 200 may be covered by a barrier layer 216. The barrier layer 216 may serve to prevent diffusion of a subsequently deposited metal layer into underlying layers, such as first dielectric layer 212. The barrier layer 216 may include any material suitable to act as a barrier. For example, in some embodiments, the barrier layer 216 may include a metal, for example, titanium (Ti), tantalum (Ta), cobalt (Co), manganese (Mn), tungsten (W), hafnium (Hf), alloys thereof, or the like, or in some embodiments, a metal nitride, such as titanium nitride (TIN), tantalum nitride (TaN), tungsten nitride (WN), or the like. The barrier layer 216 may have any thickness suitable to prevent the diffusion of subsequently deposited metal layer materials into underlying layers. For example, in some embodiments, the barrier layer 216 layer may have a thick-ness of about 10 to about 50 angstroms. The barrier layer 216 may be formed by any process suitable to provide the barrier layer 216 having a suitable thickness. For example, in some embodiments, the barrier layer 216 may be formed via a deposition process, such as chemical vapor deposition, physical vapor deposition, or a cyclical deposition process, for example, such as atomic layer deposition, or the like.

In some embodiments, and as illustrated by dotted lines in FIG. 2A, the opening 202 may extend completely through the substrate 200 and an upper surface 226 of a second substrate 228 and may form the bottom surface 208 of the opening 202. The second substrate 228 may be disposed adjacent to the second surface 206 of the substrate 200. Further (and also illustrated by dotted lines), a first conduc-tive material (e.g., conductive material 220), for example as part of a device, such as a logic device or the like, or an electrical path to a device requiring electrical connectivity, such as a gate, a contact pad, a conductive line or via, or the like, may be disposed in the upper surface 226 of the second substrate 228 and aligned with the opening 202. In some embodiments, the first conductive material (e.g., conductive material 220) aligned with the opening 202 may include copper.

In some embodiments, the substrate 200 may include a liner 224 disposed atop the barrier layer 216. The liner 224 may be formed by any process suitable to provide the liner 224 having a suitable thickness. For example, in some embodiments, the liner 224 may be formed via a deposition process, such as chemical vapor deposition, physical vapor deposition, or a cyclical deposition process, for example, such as atomic layer deposition, or the like. In embodiments, the liner 224 may have a thickness of about 10 to about 50 angstroms.

In some embodiments, the barrier layer 216 is exposed to a ruthenium precursor 234 to form a liner 224 such as a ruthenium liner on the barrier layer 216 disposed upon the sidewalls 210 and the bottom surface 208 of the opening 202. Optionally, liner 224 may be disposed directly atop first surface 204 of the substrate 200 and on the sidewalls 210 and the bottom surface 208 of the opening 202. In some embodiments, the substrate 200 may be heated prior to depositing the liner 224. In embodiments, the liner 224 is deposited to a thickness of about 10 to 100 angstroms. In embodiments, the liner 224 is conformally deposited to cover the sidewalls and bottom surface of the via, without filling the via. In some embodiments, the liner is deposited according to methods described in U.S. Pat. No. 9,677,172 entitled Methods for Forming a Cobalt-Ruthenium Liner Layer for Interconnect Structures to Applied Materials, Inc.

Figure 2C:
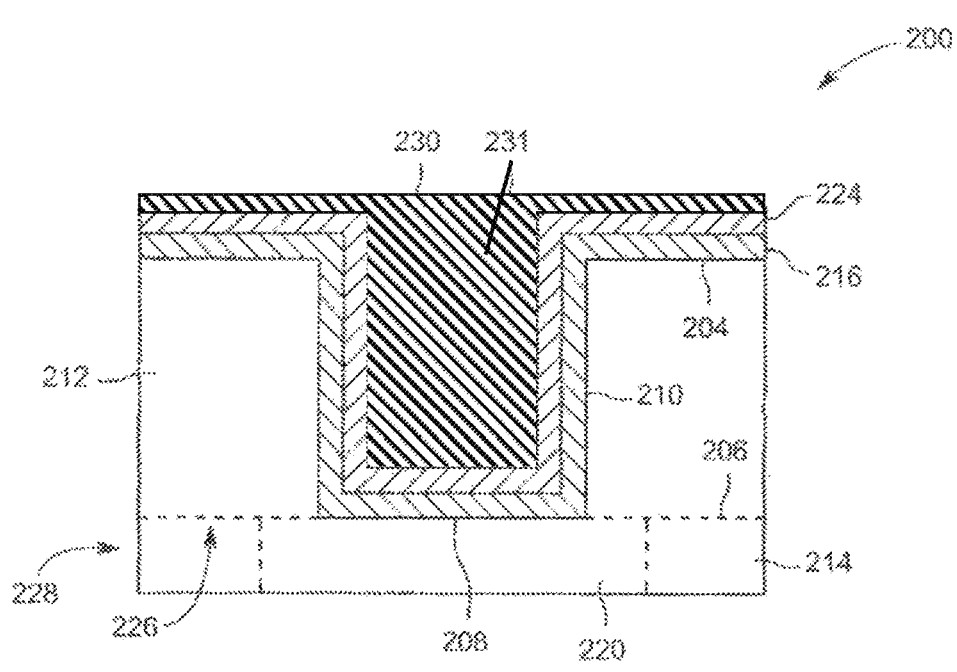

In embodiments, as depicted in FIG. 2C, following for-mation of the liner 224 such as a ruthenium liner, a con-ductive material such as second conductive material 230 may be deposited on the liner 224. For example, the second conductive material 230 may be deposited on the sidewalls 210 and the bottom surface 208 of the feature, to form a conductive layer. In some embodiments, the conductive material is deposited atop the upper surface of the substrate. In some embodiments, the second conductive material 230 may be deposited by a physical vapor deposition process. In embodiments, the second conductive material 230 may include metals, metal alloys, or the like, such as one or more of copper (Cu), aluminum (Al), tungsten (W), or the like. In some embodiments, the second conductive material 230 is copper.

In some embodiments, a conductive layer of second conductive material 230 may be heated, or annealed, to draw the deposited material into the opening 202 (for example, via capillary action). The heating process may be performed at a temperature ranging from about 150 to about 400 degrees Celsius. In some embodiments, the liner 224 allows for the second conductive material 230 to re-flow into, and fill, the opening without forming a void in the opening. Upon completion of the heating process, the bottom surface 208 of the opening 202 may be covered with deposited material. In some embodiments, the process of depositing the second conductive material 230 of a conductive layer and annealing the deposited second conductive material may be repeated to fill the opening 202. Alternatively, after filling a portion of the opening 202 is filled as described above, the remainder of the opening 202 may be filled using an electrochemical deposition process. Further, when the opening 202 has been filled by the second conductive material 230, the opening 202 may be filled above the level of the upper surface of the substrate or top surface of the dielectric layer such as a low-dielectric layer and/or deposited material, for example from the second conductive material 230, may remain on the upper surface of the substrate 200. Accordingly, techniques, such as wet clean in an acidic solution, chemical or elec-trochemical mechanical polishing, or the like may be used to remove excess deposited material from the upper surface above opening 202.

Figure 2D:
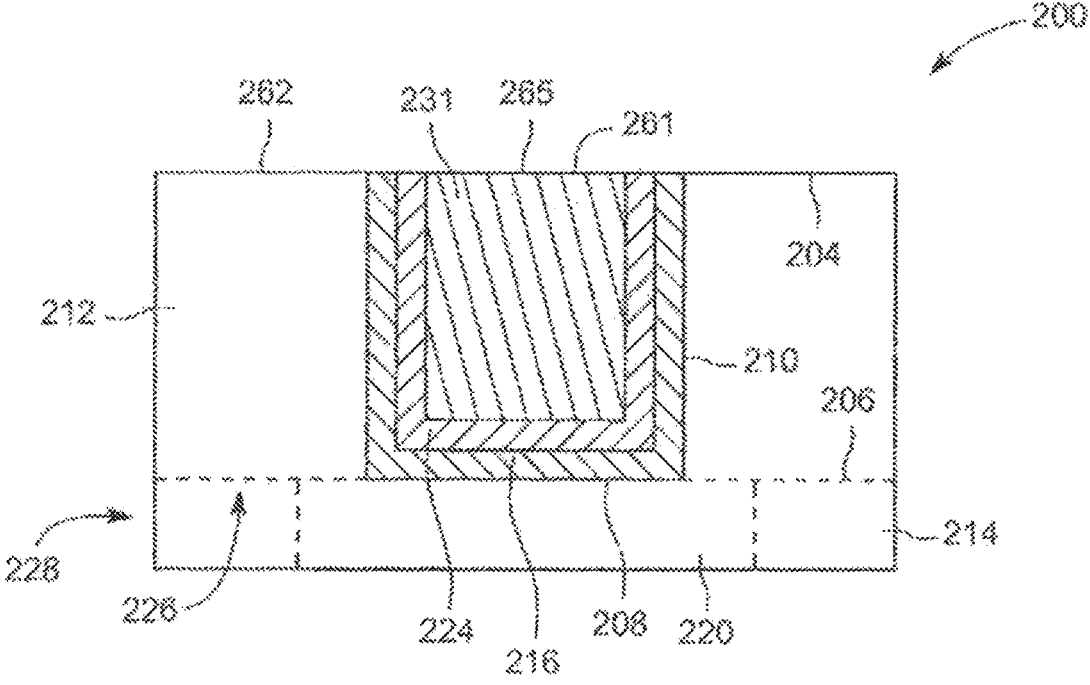

In embodiments, as depicted in FIG. 2D, following for-mation of a via 231 (FIG. 2C) filled with a conductive material such as second conductive material 230, the device may be subjected to polishing and planarization to remove layers deposited atop first surface 204. For example, a chemical mechanical planarization (CMP) method may be used to form a structure as shown in FIG. 2D with an exposed metal surface such as metal surface 261 which is, in embodiments, a top surface of a via 231 within a low-k dielectric layer including exposed dielectric layer field such as dielectric surface 262 comprised or consisting of a low-k material. In embodiments, metal surface 261 is equivalent to dielectric surface 262, for example, metal surface 261 and dielectric surface 262 form a continuous layer or continuous top surface of substrate 200. In embodiments, metal surface 261 is a top surface 265 of a via 231, wherein via 231 is formed within a low-k material such as first dielectric layer 212.

Figure 3:
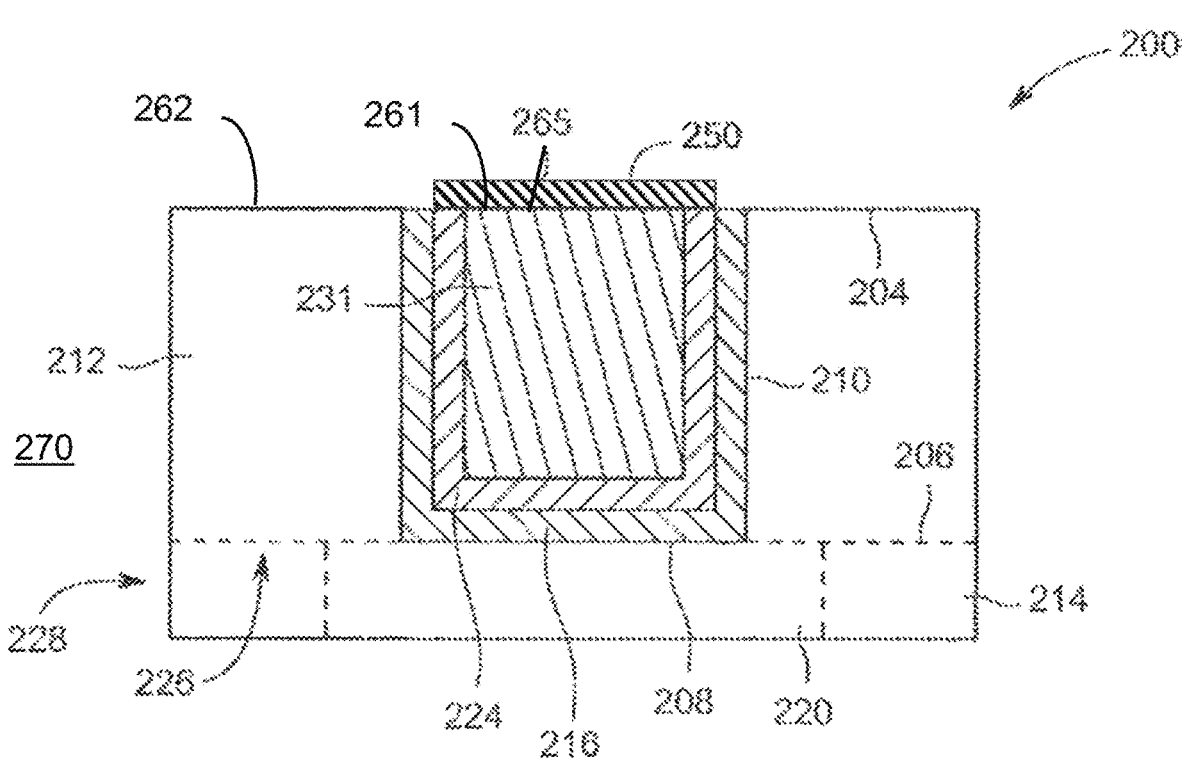
FIG. 3 depicts a side cross-sectional views of an interconnect structure having a metal cap layer formed in accordance with some embodiments of the present disclosure.

Referring now to FIG. 1 and FIG. 3, method 100 may be advantageously used to selectively deposit a ruthenium metal cap layer 250 atop an upper metal surface 261 of an interconnect 270 of a substrate 200 by performing a plurality of deposition cycles within a deposition chamber. For example, the method 100 can begin at process sequence 102 by contacting the substrate with an alkyl halide having a general formula (I):

$$R\text{—}X_a;\tag{I}$$

wherein R is an alkyl moiety having from 1 to 6 carbon atoms; each X is, independently, Br or I; and a is 1 or 2. Next, at process sequence 104, the deposition chamber is purged. Subsequently, at process sequence 106, the substrate is contacted with a ruthenium metal precursor having a general formula (II):

$$R^1\text{—}Ru\text{—}R^2;\tag{II}$$

wherein $R^1$ comprises a substituted aromatic ring and $R^2$ is a diene comprising at least 4 carbon atoms; and (process sequence 108) purging the deposition chamber. Process sequence 102 to process sequence 108 can be repeated, as indicated by arrow 110, as desired to selectively deposit the ruthenium metal cap layer 250 to a desired thickness.

The cycle of process sequence 102 through process sequence 108 can be repeated a plurality of times, as indicated by arrow 110 in FIG. 1, to produce the ruthenium metal capping layer 250 atop an upper metal surface 261 of an interconnect 270 e.g., a via 231, of a substrate 200. In embodiments, process sequence 102 through process sequence 108 is repeated at least two times, or at least 10 times, or at least 20 times, or at least 50 times, or at least 100 times, or at least 200 times.

In embodiments, the substrate is contacted with the alkyl halide at a temperature of less than or equal to about 300° C. In some embodiments, the substrate is contacted with the alkyl halide at a temperature of greater than or equal to about 50° C., and less than or equal to about 290° C., or less than or equal to about 250° C., or less than or equal to about 230° C., or less than or equal to about 200° C., or less than or equal to about 180° C., or less than or equal to about 150° C.

In embodiments, the substrate is contacted with the ruthenium metal precursor at a temperature of less than or equal to about 300° C. In some embodiments, the substrate is contacted with the ruthenium metal precursor at a temperature of greater than or equal to about 50° C., and less than or equal to about 290° C., or less than or equal to about 250° C., or less than or equal to about 230° C., or less than or equal to about 200° C., or less than or equal to about 180° C., or less than or equal to about 150° C.

In some embodiments, the substrate is contacted with the alkyl halide at essentially the same temperature at which the substrate is contacted with the ruthenium metal precursor. In other embodiments, the substrate is contacted with the alkyl halide at a higher temperature than the temperature at which the substrate is contacted with the ruthenium metal precursor. In other embodiments, the substrate is contacted with the alkyl halide at a lower temperature than the temperature at which the substrate is contacted with the ruthenium metal precursor.

In embodiments, the substrate is contacted with the alkyl halide for less than or equal to about 100 seconds. In some embodiments, the substrate is contacted with the alkyl halide for greater than or equal to about 0.1 seconds, and less than or equal to about 60 seconds, or less than or equal to about 30 seconds, or less than or equal to about 10 seconds, or less than or equal to about 5 seconds, or less than or equal to about 3 seconds, or less than or equal to about 1 second per cycle.

In embodiments, the substrate is contacted with the ruthenium metal precursor for less than or equal to about 100 seconds. In some embodiments, the substrate is contacted with the ruthenium metal precursor for greater than or equal to about 0.1 seconds, and less than or equal to about 60 seconds, or less than or equal to about 30 seconds, or less than or equal to about 10 seconds, or less than or equal to about 5 seconds, or less than or equal to about 3 seconds, or less than or equal to about 1 second per cycle.

In embodiments, the ruthenium metal precursor has a general formula (II):

$$R^1\text{—}Ru\text{—}R^2\tag{II}$$

wherein $R^1$ comprises a substituted aromatic ring; and $R^2$ is a diene comprising at least 4 carbon atoms. In some embodiments, $R^1$ comprises a $C_1$-$C_6$ alkyl or dialkyl substituted benzene ring.

In embodiments, $R^1$ comprises a $C_1$-$C_4$ alkyl or dialkyl substituted benzene ring. In embodiments, at least one of the alkyl substitutions is a methyl, ethyl, propyl, isopropyl, butyl, isobutyl, sec-butyl, tertiary butyl, pentyl, isopentyl, or hexyl. In some embodiments, $R^1$ comprises methyl, ethyl, iso-propyl, or tertiary butyl. In some embodiments, $R^1$ is a toluene radical, an ethyl benzene radical, an ortho xylene radical, a meta xylene radical, a para-xylene radical, a 2-ethyltoluene radical, a 3-ethyltoluene radical, a 4-ethyltoluene radical, or a para-cymene radical.

In embodiments, each of the alkyl substituents are different. In other embodiments, each of the alkyl substituents are the same. In embodiments, $R^1$ is a geminal dialkyl substituted benzene ring.

In embodiments, $R^1$ is a toluene radical, an ortho xylene radical, or a para-xylene radical.

In embodiments of the ruthenium metal precursor, $R^1$ represents a mixture of $C_1$-$C_6$ alkyl or dialkyl substituted benzene ring radicals. In other embodiments, $R^1$ represents essentially a single $C_1$-$C_6$ alkyl or dialkyl substituted benzene ring.

In some embodiments, $R^2$ comprises a 1,3 diene comprising from 4 to 10 carbon atoms. In some embodiments $R^2$ comprises a 1,4 diene comprising from 5 to 10 carbon atoms, or from 5 to 8 carbon atoms, or from 5 to 6 carbon atoms. In embodiments, $R^2$ comprises a dialkyl substituted diene comprising 6 or more carbon atoms. In embodiments, $R^2$ comprises a 1,4 diene comprising from 4 to 10 carbon atoms. In some embodiments $R^2$ comprises a 1,4 diene comprising from 5 to 10 carbon atoms, or from 5 to 8 carbon atoms, or from 5 to 6 carbon atoms.

In embodiments, $R^2$ comprises a 1,4 diene comprising from 5 to 10 carbon atoms comprising an alkyl substituted $sp^3$ between the two double bonds.

In some embodiments, $R^2$ comprises an unsubstituted $C_3$-$C_{10}$ alicyclic diene, a substituted $C_4$-$C_{10}$ alicyclic diene, or a combination thereof.

In embodiments of the ruthenium metal precursor, $R^2$ represents a mixture of diene moieties. In other embodiments, $R^2$ represents essentially a single diene moiety.

In embodiments, $R^2$ is 1,3-butadiene, 1,3-pentadiene, 1,4-pentadiene, 1,5-hexadiene, 1,4-hexadiene, 1,3-hexadiene, 1,3-cyclohexadiene; 1,4-cyclohexadiene; $C_1$ to $C_4$ alkyl substituted 1,4-cyclohexadiene, methyl substituted 1,4-cyclohexyl diene, isoprene, 2,3-dimethyl-1,3-butadiene, or a combination thereof.

In embodiments, $R^2$ comprises an isoprene moiety. In embodiments $R^2$ comprises a butadiene moiety.

In embodiments, $R^2$ comprises a 2,3-dimethyl-1,3-butadiene moiety.

In embodiments, the alkyl halide is a $C_1$ to $C_{10}$ halogenated compound, or a $C_1$ to $C_6$ halogenated compound, or a $C_1$ to $C_4$ halogenated compound, or a $C_1$ to $C_3$ halogenated compound, or a $C_1$ to $C_2$ halogenated compound, or a halogenated methane. In embodiments, the alkyl halide comprises at least one halogen atom. In embodiments, the alkyl halide comprises at least two halogen atoms. In embodiments, the alkyl halide comprises one or more carbon-carbon double bonds. In embodiments, the alkyl halide comprises at least one halogen atom selected from chlorine, bromine or iodine. In embodiments, the alkyl halide comprises at least one halogen atom selected from bromine or iodine.

In embodiments, the alkyl halide comprises 1 to 3 carbon atoms and from 1 to 3 iodine atoms. In embodiments, the alkyl halide is methyl iodide, diiodomethane, methylbromide, dibromomethane, bromoiodomethane, or a combination thereof. In some embodiments, the alkyl halide consists essentially of diiodomethane.

In embodiments of the alkyl halide is a mixture of compounds. In other embodiments, the alkyl halide is a single compound.

In some embodiments, the method includes flowing a reducing agent along with the precursor gas. The reducing agent may comprise, for example, at least one of hydrogen ($H_2$), ammonia ($NH_3$), oxygen ($O_2$), or hydrogen incorporated gases or the like. General processing conditions for forming capping layer include maintaining process chamber pressure at about 1 to about 30 Torr.

In some embodiments, the ruthenium metal cap layer is deposited at a rate of greater than or equal to about 0.2 Å/cycle, or greater than or equal to about 0.3 Å/cycle, or greater than or equal to about 0.4 Å/cycle, or greater than or equal to about 0.5 Å/cycle, or greater than or equal to about 1 Å/cycle.

The inventors have discovered that ALD processes according to embodiments disclosed herein, may be conducted at relatively low temperatures, compared to other processes. The inventors have observed that the alkyl halides utilized at temperatures according to embodiments disclosed herein, result in metal layers suitable for ruthenium atomic layer desorption without significant amounts of contamination, and that use of the ruthenium metal precursors disclosed herein, result in the formation of ruthenium metal cap layers, and produce volatile organic reaction products that are easily removed when utilized at temperatures according to embodiments disclosed herein. In some embodiments, the ruthenium metal cap layer has a carbon content less than or equal to about 2% carbon on an atomic basis, or less than or equal to about 1% carbon, or less than or equal to about 0.5% carbon, or less than or equal to about 0.1% carbon on an atomic basis. In embodiments, the ruthenium metal cap layer has a purity of greater than or equal to about 97 wt % ruthenium metal, or greater than or equal to about 98 wt % ruthenium metal, or greater than or equal to about 99 wt % ruthenium metal, or greater than or equal to about 99.5 wt % ruthenium metal.

In embodiments, the deposition cycle does not include the formation or in any way a utilization of a plasma. Stated another way, the deposition cycle is plasma-free. The inventors have observed that the lack of plasma utilization according to embodiments disclosed herein, results in improved performance of the resultant interconnects.

In embodiments, an interconnect comprises a copper metal fill material encapsulated within a ruthenium liner and the ruthenium metal cap layer. The inventors discovered that the ruthenium liner enables void free copper reflow at interconnect widths below those suitable for use with cobalt or mixtures of cobalt and ruthenium. In embodiments, the interconnect has a width of less than or equal to about 20 nm, or less than or equal to about 15 nm, or less than or equal to about 10 nm, or less than or equal to about 5 nm. In embodiments, the ruthenium metal cap layer has a thickness of less than or equal to about 2 nm, or less than or equal to about 1 nm, or less than or equal to about 0.5 nm.

Figure 4:
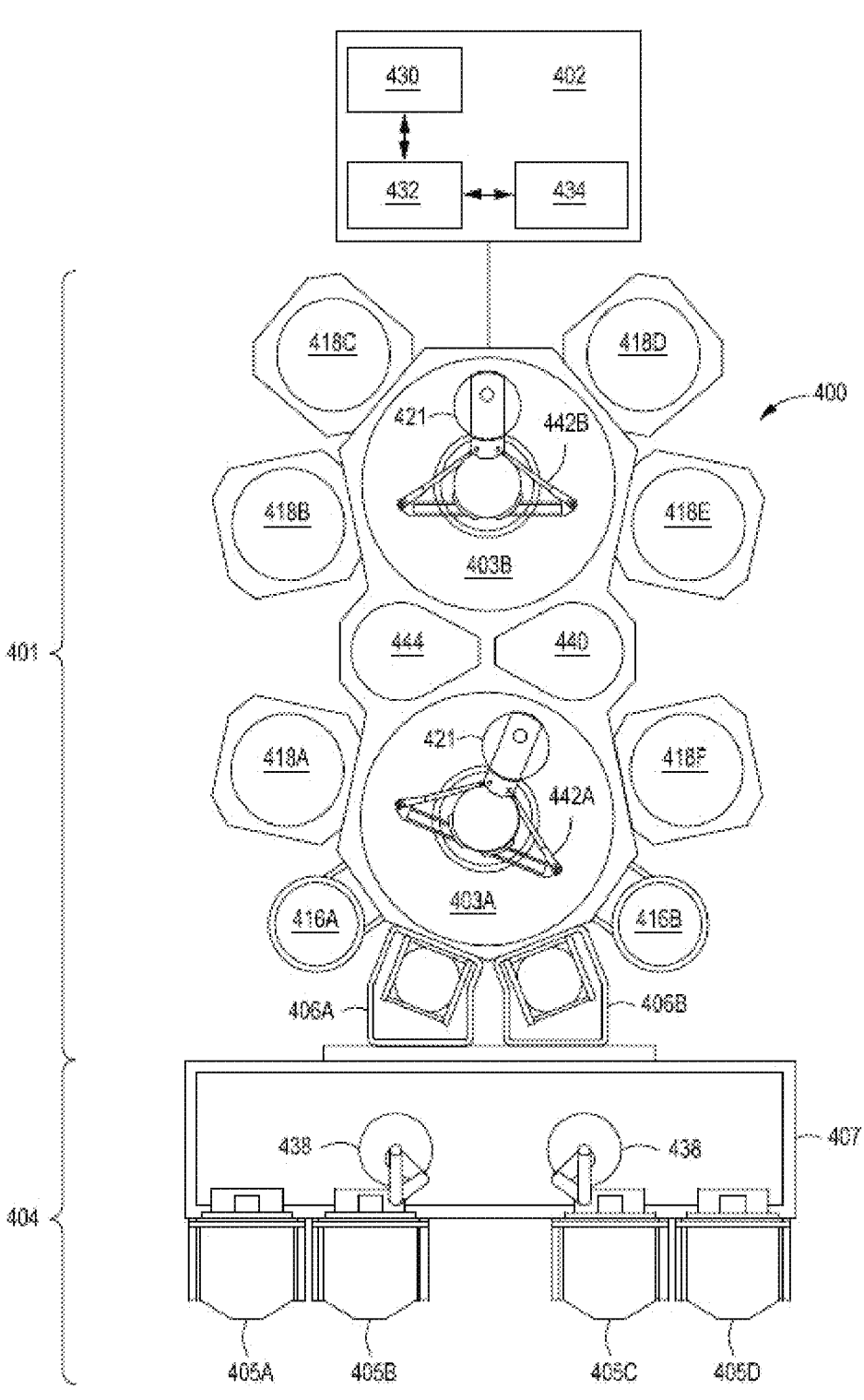
FIG. 4 depicts a cluster tool suitable to perform methods for processing a substrate in accordance with some embodiments of the present disclosure.

The methods described herein may be performed in individual process chambers that may be provided in a standalone configuration or as part of a cluster tool, for example, an integrated tool 300 (i.e., cluster tool) described below with respect to FIG. 4. The methods described herein may be practiced using cluster tools having suitable process chambers coupled thereto, or in other suitable process chambers. For example, in some embodiments the inventive methods discussed above may advantageously be performed in an integrated tool such that there are limited or no vacuum breaks between processes, limiting or preventing contamination of the substrate such as oxidation and the like. The integrated tool 400 includes a vacuum-tight processing platform 401, a factory interface 404, and a system controller 402. The processing platform 401 comprises multiple process chambers, such as 418A, 418B, 418C, 418D, 418E, and 418F operatively coupled to a vacuum substrate transfer chamber (transfer chambers 403A, 403B). The factory interface 404 is operatively coupled to the transfer chamber 403A by one or more load lock chambers (two load lock chambers, such as 406A and 406B shown in FIG. 4).

In some embodiments, the factory interface 404 comprises at least one docking station 407, at least one factory interface robot 438 to facilitate the transfer of the semiconductor substrates. The docking station 407 is configured to accept one or more front opening unified pod (FOUP). Four FOUPS, such as 405A, 405B, 405C, and 405D are shown in the embodiment of FIG. 4. The factory interface robot 438 is configured to transfer the substrates from the factory interface 404 to the processing platform 401 through the load lock chambers, such as 406A and 406B. Each of the load lock chambers 406A and 406B have a first port coupled to the factory interface 404 and a second port coupled to the transfer chamber 403A. The load lock chamber 406A and 406B are coupled to a pressure control system (not shown) which pumps down and vents the load lock chambers 406A and 406B to facilitate passing the substrates between the vacuum environment of the transfer chamber 403A and the substantially ambient (e.g., atmospheric) environment of the factory interface 404. The transfer chambers 403A, 403B have vacuum robots 442A, 442B disposed in the respective transfer chambers 403A, 403B. The vacuum robot 442A is capable of transferring substrates 421 (e.g., the substrate 200 during performance of the method 100) between the load lock chamber 406A, 406B, the process chambers 414A and 414F and a cooldown station 440 or a pre-clean station 444. The vacuum robot 442B is capable of transferring substrates 421 between the cooldown station 440 or pre-clean station 444 and the process chambers 414B, 414C, 414D, and 414E.

In some embodiments, the process chambers 414A, 414B, 414C, 414D, 414E, and 414F are coupled to the transfer chambers 403A, 403B. The process chambers 414A, 414B, 414C, 414D, 414E, and 414F may comprise, for example, substrate soaking chambers, atomic layer deposition (ALD) process chambers, physical vapor deposition (PVD) process chambers, remote plasma chambers, chemical vapor deposition (CVD) chambers, annealing chambers, or the like. The chambers may include any chambers suitable to perform all or portions of the methods described herein, as discussed above, such as one or more PVD chambers configured to deposit the low energy buffer layer and the high energy liner layer, one or more CVD chambers configured to deposit a conductive fill, and the like. In some embodiments, one or more optional service chambers (shown as 416A and 416B) may be coupled to the transfer chamber 403A. The service chambers 416A and 416B may be configured to perform other substrate processes, such as degassing, orientation, substrate metrology, cool down, and the like.

The system controller 402 controls the operation of the tool 400 using a direct control of the process chambers 414A, 414B, 414C, 414D, 414E, and 414F or alternatively, by controlling the computers (or controllers) associated with the process chambers 414A, 414B, 414C, 414D, 414E, and 414F and the tool 400. In operation, the system controller 402 enables data collection and feedback from the respective chambers and systems to optimize performance of the tool 400. The system controller 402 generally includes a central processing unit (CPU) 430, a memory 434, and a support circuit 432. The system controller 402 can be configured similar to the controller 340 described above. Software routines, such as methods as described above may be stored in the memory 434 and, when executed by the CPU 430, transform the CPU 430 into a specific purpose computer (system controller) 402. The software routines may also be stored and/or executed by a second controller (not shown) that is located remotely from the tool 400.

In some embodiments, the deposition cycle may be maintained or may be varied throughout multiple deposition steps to obtain a film composition through the capping layer in any desired embodiment. For example, the deposition cycle may be uniform to deposit a capping layer having a substantially uniform thickness throughout. Alternatively, the deposition cycle may be varied to deposit a capping layer having a desired thickness distribution.

EMBODIMENTS

The following non-limiting list of embodiments are contemplated.

E1. A method of selectively depositing a ruthenium metal cap layer atop an upper metal surface of an interconnect of a substrate, comprising:
contacting the substrate with an alkyl halide having a general formula (I):

$$R-X_a; \tag{I}$$

wherein R is an alkyl moiety having from 1 to 6 carbon atoms and each X is, independently, Br or I; and a is 1 or 2; and
contacting the substrate with a ruthenium metal precursor having a general formula (II):

$$R^1-Ru-R^2; \tag{II}$$

wherein $R^1$ comprises a substituted aromatic ring; and $R^2$ is a diene comprising at least 4 carbon atoms.

E2. The method according to embodiment E1, wherein the substrate is contacted with the alkyl halide at a temperature of less than or equal to about 300° C. for less than or equal to about 10 seconds.

E3. The method according to embodiment E1 or E2, wherein the substrate is contacted with the ruthenium metal precursor at a temperature of less than or equal to about 300° C. for less than or equal to about 10 seconds.

E4. The method according to embodiments E1 through E3, wherein $R^1$ comprises a $C_1$-$C_6$ alkyl or dialkyl substituted benzene ring.

E5. The method according to embodiments E1 through E4, wherein $R^2$ comprises a 1,3 diene comprising from 4 to 6 carbon atoms.

E6. The method according to embodiments E1 through E5, wherein $R^2$ comprises a 1,4 diene comprising from 5 to 6 carbon atoms.

E7. The method according to embodiments E1 through E6, wherein $R^2$ comprises an alicyclic diene.

E8. The method according to embodiments E1 through E7, wherein $R^2$ comprises a dialkyl substituted diene comprising 6 or more carbon atoms.

E9. The method according to embodiments E1 through E8, wherein $R^2$ comprises an isoprene moiety.

E10. The method according to embodiments E1 through E9, wherein $R^2$ comprises a 2,3-dimethyl-1,3-butadiene moiety.

E11. The method according to embodiments E1 through E10, wherein the alkyl halide is methyl iodide, diiodomethane, methylbromide, dibromomethane, bromoiodomethane, or a combination thereof.

E12. The method according to embodiments E1 through E11, wherein the alkyl halide consists essentially of diiodomethane.

E13. The method according to embodiments E1 through E12 of selectively depositing a ruthenium metal cap layer atop an upper metal surface of an interconnect of a substrate, comprising:
performing a plurality of deposition cycles within a deposition chamber, each deposition cycle comprising:
    a) contacting the substrate with an alkyl halide having a general formula (I):

$$R-X_a; \tag{I}$$

wherein R is an alkyl moiety having from 1 to 6 carbon atoms; each X is, independently, Br or I; and a is 1 or 2;
    b) purging the deposition chamber;
    c) contacting the substrate with a ruthenium metal precursor having a general formula (II):

$$R^1-Ru-R^2; \tag{II}$$

wherein $R^1$ comprises a substituted aromatic ring and $R^2$ is a diene comprising at least 4 carbon atoms; and
    d) purging the deposition chamber.

E14. A method of selectively depositing a ruthenium metal cap layer atop an upper metal surface of an interconnect of a substrate, comprising:
performing a plurality of deposition cycles within a deposition chamber, each deposition cycle comprising:
    a) contacting the substrate with an alkyl halide having a general formula (I):

$$R-X_a; \tag{I}$$

wherein R is an alkyl moiety having from 1 to 6 carbon atoms; each X is, independently, Br or I; and a is 1 or 2;
    b) purging the deposition chamber;
    c) contacting the substrate with a ruthenium metal precursor having a general formula (II):

$$R^1\!-\!Ru\!-\!R^2; \tag{II}$$

wherein $R^1$ comprises a substituted aromatic ring and $R^2$ is a diene comprising at least 4 carbon atoms; and d) purging the deposition chamber.

E15. The method according to embodiments E1 through E14, wherein the ruthenium metal cap layer is deposited at a rate of greater than or equal to about 0.2 Å/cycle.

E16. The method according to embodiments E1 through E15, wherein the ruthenium metal cap layer has a carbon content less than or equal to about 2% carbon on an atomic basis.

E17. The method according to embodiments E1 through E16, wherein the ruthenium metal cap layer has a purity of greater than or equal to about 97 wt % ruthenium metal.

E18. The method according to embodiments E1 through E17, wherein the deposition cycle does not include formation or utilization of a plasma.

E19. The method according to embodiments E1 through E18, wherein the interconnect further comprises a copper metal fill material encapsulated within a ruthenium liner and the ruthenium metal cap layer.

E20. The method according to embodiments E1 through E19, wherein the interconnect has a width of less than or equal to about 20 nm.

E21. The method according to embodiments E1 through E20, wherein the ruthenium metal cap layer has a thickness of less than or equal to about 2 nm.

While the foregoing is directed to embodiments of the present disclosure, other and further embodiments of the disclosure may be devised without departing from the basic scope thereof.

We claim:

1. A method of selectively depositing a ruthenium metal cap layer atop an upper metal surface of an interconnect of a substrate, comprising:

contacting the substrate with an alkyl halide having a general formula (I):

$$R\!-\!X_a; \tag{I}$$

wherein R is an alkyl moiety having from 1 to 6 carbon atoms and each X is, independently, Br or I; and a is 1 or 2; and contacting the substrate with a ruthenium metal precursor having a general formula (II):

$$R^1\!-\!Ru\!-\!R^2; \tag{II}$$

wherein $R^1$ comprises a substituted aromatic ring; and $R^2$ is a diene comprising at least 4 carbon atoms.

2. The method of claim 1, wherein the substrate is contacted with the alkyl halide at a temperature of less than or equal to about 300° C. for less than or equal to about 10 seconds.

3. The method of claim 1, wherein the substrate is contacted with the ruthenium metal precursor at a temperature of less than or equal to about 300° C. for less than or equal to about 10 seconds.

4. The method of claim 1, wherein $R^1$ comprises a $C_1$-$C_6$ alkyl or dialkyl substituted benzene ring.

5. The method of claim 1, wherein $R^2$ comprises a 1,3 diene comprising from 4 to 6 carbon atoms.

6. The method of claim 1, wherein $R^2$ comprises a 1,4 diene comprising from 5 to 6 carbon atoms.

7. The method of claim 1, wherein $R^2$ comprises an alicyclic diene.

8. The method of claim 1, wherein $R^2$ comprises a dialkyl substituted diene comprising 6 or more carbon atoms.

9. The method of claim 1, wherein $R^2$ comprises an isoprene moiety.

10. The method of claim 1, wherein $R^2$ comprises a 2,3-dimethyl-1,3-butadiene moiety.

11. The method of claim 1, wherein the alkyl halide is methyl iodide, diiodomethane, methylbromide, dibromomethane, bromoiodomethane, or a combination thereof.

12. The method of claim 1, wherein the alkyl halide consists essentially of diiodomethane.

13. A method of selectively depositing a ruthenium metal cap layer atop an upper metal surface of an interconnect of a substrate, comprising:

performing a plurality of deposition cycles within a deposition chamber, each deposition cycle comprising:

a) contacting the substrate with an alkyl halide having a general formula (I):

$$R\!-\!X_a; \tag{I}$$

wherein R is an alkyl moiety having from 1 to 6 carbon atoms; each X is, independently, Br or I; and a is 1 or 2;

b) purging the deposition chamber;

c) contacting the substrate with a ruthenium metal precursor having a general formula (II):

$$R^1\!-\!Ru\!-\!R^2; \tag{II}$$

wherein $R^1$ comprises a substituted aromatic ring and $R^2$ is a diene comprising at least 4 carbon atoms; and d) purging the deposition chamber.

14. The method of claim 13, wherein the ruthenium metal cap layer is deposited at a rate of greater than or equal to about 0.2 Å/cycle.

15. The method of claim 13, wherein the ruthenium metal cap layer has a carbon content less than or equal to about 2% carbon on an atomic basis.

16. The method of claim 13, wherein the ruthenium metal cap layer has a purity of greater than or equal to about 97 wt % ruthenium metal.

17. The method of claim 13, wherein the deposition cycle does not include formation or utilization of a plasma.

18. The method of claim 13, wherein the interconnect further comprises a copper metal fill material encapsulated within a ruthenium liner and the ruthenium metal cap layer.

19. The method of claim 13, wherein the interconnect has a width of less than or equal to about 20 nm.

20. The method of claim 13, wherein the ruthenium metal cap layer has a thickness of less than or equal to about 2 nm.

* * * * *